United States Patent [19]

Harriott et al.

[11] Patent Number: 4,897,361

[45] Date of Patent: Jan. 30, 1990

[54] PATTERNING METHOD IN THE MANUFACTURE OF MINIATURIZED DEVICES

[75] Inventors: Lloyd R. Harriott, Hillsborough Township, Somerset County; Morton B. Panish, Springfield; Henryk Temkin, Berkeley Heights, all of N.J.

[73] Assignee: American Telephone & Telegraph Company, AT&T Bell Laboratories, Murray Hill, N.J.

[21] Appl. No.: 132,757

[22] Filed: Dec. 14, 1987

[51] Int. Cl.$^4$ .................. H01L 21/265; H01L 21/20
[52] U.S. Cl. ............... 437/24; 148/DIG. 72; 148/DIG. 51; 148/DIG. 84; 148/DIG. 106; 148/DIG. 149; 156/662; 156/612; 437/22; 437/90; 437/132; 437/228; 437/935; 437/936
[58] Field of Search ............... 148/DIG. 26, DIG. 50, 148/DIG. 51, DIG. 84, DIG. 72, DIG. 106, DIG. 149; 156/643, 655, 662, 610, 612; 204/192.34; 437/18, 22, 24, 89, 90, 105–107, 126, 132, 133, 228, 930, 935, 936; 430/297

[56] References Cited

U.S. PATENT DOCUMENTS

| | | | |
|---|---|---|---|
| 4,137,107 | 1/1979 | Nijman et al. | 437/127 |
| 4,276,368 | 6/1981 | Heller et al. | 430/323 |
| 4,354,898 | 10/1982 | Coldren et al. | 156/647 |
| 4,371,412 | 2/1983 | Nishizawa | 156/657 |
| 4,404,072 | 9/1983 | Kohl et al. | 204/129.3 |
| 4,450,041 | 5/1984 | Aklufi | 156/643 |
| 4,575,924 | 3/1986 | Reed et al. | 437/133 |
| 4,637,129 | 1/1987 | Derkits et al. | 29/578 |
| 4,648,095 | 3/1987 | Iwasaki et al. | 357/17 |
| 4,678,096 | 6/1987 | Salzman et al. | 372/50 |
| 4,692,207 | 9/1987 | Bouadma et al. | 372/48 |
| 4,698,129 | 10/1987 | Puretz et al. | 156/643 |
| 4,711,857 | 12/1987 | Cheng | 437/131 |
| 4,717,681 | 1/1988 | Curran | 437/106 |
| 4,731,158 | 3/1988 | Brannon | 156/643 |
| 4,733,283 | 3/1988 | Kuroda | 357/22 |
| 4,742,379 | 5/1988 | Yamashita et al. | 357/16 |
| 4,773,076 | 9/1988 | Yamamoto et al. | 372/48 |

OTHER PUBLICATIONS

Komuro et al., "Maskless Etching of a Nanometer Structure by Focused Ion Beams", J. Vac. Sci. Technol. B1 (4), Oct.-Dec. 1983, pp. 985-989.
Ochiai et al., "Maskless Ion Beam Assisted Etching of Si Using Chlorine Gas", Jap. J. Appl. Phys., vol. 24, No. 3, Mar. 1985, pp. L169-L172.
Chi et al., "Ion Beam Damage-Induced Masking for Photoelectrochemical Etching of IV-V Semiconductors", J. Appl. Phys. 60 (11), 1 Dec. 1986, pp. 4012-4014.
La Marche et al., "Focused Ion Beam Microlithography...", J. Vac. Sci. Technol., B1 (4), Oct.-Dec. 1983, pp. 1056-1058.
Harriott et al., "Decomposition of Palladium Acetate Films With a Microfocused Ion Beam," Appl. Phys. Lett. 49 (24), 15 Dec. 1986, pp. 1661-1662.
Kondo et al., "Gallium and Hydrogen Ion Irradiation During GaAs Molecular Beam Epitaxy," Jap. J. Appl. Phys., vol. 24, No. 5, May 1985, pp. L370-L372.
Kuwano, "Dry Development of Resists Exposed to Low-Energy Focused Gallium Ion Beam", J. Appl. Phys. 55 (4), 15 Feb. 1984, pp. 1149-1154.
"New Diffraction Grating Profiles in InP for DFB Lasers and Integrated Optics", Electronics Letters, vol. 19 (1983), pp. 1076-1077, by L. D. Westbrook et al.

*Primary Examiner*—Olik Chaudhuri
*Assistant Examiner*—William Bunch
*Attorney, Agent, or Firm*—Peter A. Businger

[57] ABSTRACT

When high-vacuum methods are used in the manufacture of miniaturized devices such as, e.g., semiconductor integrated-circuit devices, device layers on a substrate are preferably patterned without breaking of the vacuum. Preferred patterning involves deposition of a semiconductor mask layer, generation of the pattern in the mask layer by ion deflected-beam writing, and transfer of the pattern by dry etching. When the mask layer is an epitaxial layer, further epitaxial layer deposition after patterning may proceed without removal of remaining mask layer material.

16 Claims, 1 Drawing Sheet 4,897,361

PATTERNING METHOD IN THE MANUFACTURE OF MINIATURIZED DEVICES

TECHNICAL FIELD

In the manufacture of miniaturized devices such as, e.g., semiconductor integrated-circuit devices, the invention is concerned with patterning by selective removal of surface material.

BACKGROUND OF THE INVENTION

The manufacture of miniaturized devices such as, e.g., integrated-circuit, optical, opto-electronic, and magneto-optical devices typically involves the deposition and patterning of layers on a substrate, patterning being understood as involving selective removal of surface material. Prominent among patterning techniques in current use are those based on photolithographic processing—typically involving the deposition of an organic "resist" layer on a surface to be patterned, definition of a desired pattern in the resist layer by exposure to suitable radiation, chemical removal of exposed (or unexposed) resist material, and chemical transfer of the pattern. Variants of this patterning method may involve the use of alternate resist or mask materials such as silica, chalcogenide, or metallic material, and transfer of a pattern may involve the use of more elaborate means such as, e.g., a plasma. The following published items are cited as representative of such methods:

U.S. Pat. No. 4,276,368, issued June 30, 1981 to A. Heller et al., "Photoinduced Migration of Silver into Chalcogenide Layer";

U.S. Pat. No. 4,354,898, issued Oct. 19, 1982 to L. A. Coldren et al., "Method of Preferentially Etching Optically Flat Mirror Facets in InGaAs/InP Heterostructures";

L. D. Westbrook et al., "New Diffraction Grating Profiles in InP for DFB Lasers and Integrated Optics", Electronics Letters, Vol. 19 (1983), pp. 1076–1077; and U.S. Pat. No. 4,637,129; issued Jan. 20, 1987 to G. E. Derkits, Jr. et al., "Selective Area III-V Growth and Lift-off Using Tungsten Patterning".

Patterning as described above typically is carried out at atmospheric pressure; accordingly, such patterning is well-suited for use in combination with atmospheric-pressure deposition methods such as e.g., liquid-phase or vapor-phase epitaxy. However, certain device structures (especially those requiring highly accurate layer thickness control) preferably involved layer deposition under high-vacuum conditions, e.g., by molecular-beam epitaxy.

While it is possible to produce patterns under high-vacuum conditions by (deflected-beam) ion exposure, such patterning is considered impractical due to its inherent slowness in removing relatively large volumes of material. Accordingly, and especially in combination with high-vacuum layer deposition, it is desirable to provide for patterning procedures which are suitable to be carried out under high-vacuum conditions also, and which involve the removal or modification of but a small volume of material, thereby providing for efficacious patterning of vacuum-deposited layers without breaking of the vacuum.

SUMMARY OF THE INVENTION

In the interest of facilitating patterning of layers such as, e.g., Group III–4 and Group IV semiconductor layers on a substrate, and in the interest especially of facilitating patterning under high-vacuum conditions, a pattern is defined or generated in a semiconductor mask layer. Typically, pattern generation is by selective exposure of the mask layer to a (deflected) beam of energetic ions as used, e.g., for removing or damaging mask-layer material, or for ion implantation. In cases where such pattern generation results in selective uncovering of underlying layer material, a generated pattern is then transferred to the underlying layer by exposure to a removal agent which is chosen so as to leave mask-layer material unaffected or at least less affected than material to be removed. In other cases a developing step may be required prior to transfer, such step involving the use of a developing agent which is chosen to remove either exposed or else unexposed mask-layer material (as resulting, respectively, in a positive or a negative patterning method). The developing agent may be the same as the removal agent.

As the removal agent can be chosen to act with sufficiently greater efficacy on uncovered underlying layer material as compared with remaining mask material, relatively thin mask layers can be used as motivated by the desirability of high-speed pattern generation in the mask layer. In this respect, use of epitaxial mask layers is preferred. Epitaxially deposited mask layers are preferred also if, subsequent to transfer to the pattern, remaining mask material is buried in the course of further epitaxial layer deposition.

DETAILED DESCRIPTION

Figure 1:
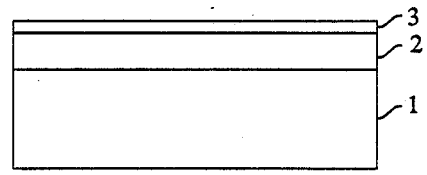
FIG. 1 is a schematic representation of a structure comprising a semiconductor mask layer prior to patterning.
Figure 2:
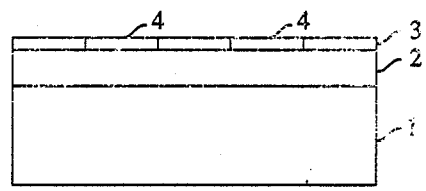
FIG. 2 is a schematic representation of the structure of FIG. 1 after exposure to pattern-generating radiation.
Figure 5:
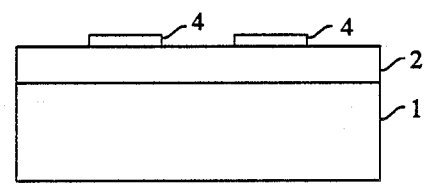
FIG. 5 is a schematic representation of the structure of FIG. 1 after removal of unexposed mask-layer material as practiced in a negative patterning method alternative to the positive patterning method of FIGS. 3 and 4.
Figure 6:
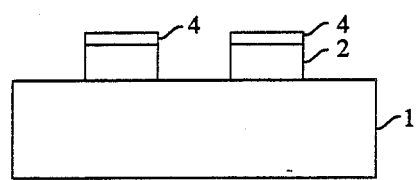
FIG. 6 is a schematic representation of the structure of FIG. 5, the pattern defined in the mask layer having been transferred by selective removal through openings in the mask layer.

Schematically shown in the Figures are substrate 1, layer 2, unexposed semiconductor mask-layer material 3, and irradiated or exposed semiconductor mask-layer material 4. FIGS. 1, 2, 3, and 4 can be viewed as representing sequential stages of a positive patterning process in accordance with a first preferred embodiment of the invention, and FIGS. 1, 2, 5, and 6 as corresponding to a negative patterning process in accordance with a second preferred embodiment of the invention. Specifically, in FIG. 1, a semiconductor layer 3 intended as a mask layer is shown as deposited on layer 2. In FIG. 2, the mask layer comprises unexposed portions 3 and irradiated portions 4. Either irradiated portions 4 or unexposed portions 3 are removed as respectively shown in FIGS. 3 and 5, and uncovered portions of layer 2 are removed as shown in corresponding FIGS. 4 and 6.

In the interest of minimizing the time required for pattern generation, mask layer thickness preferably does not exceed approximately 100 Angstroms. Choice of mask layer thickness is further influenced by the difference between the etch rate of the mask material remaining after pattern generation on the one hand, and that of the underlying layer material on the other, so that a desired depth of etching is achieved while areas not to be etched remain protected. When mask layers are deposited epitaxially and with sufficient uniformity, mask layer thickness may be as little as 30 Angstroms or even less.

Figure 3:
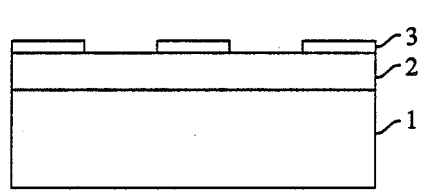
FIG. 3 is a schematic representation of the structure of FIG. 2 after removal of irradiated mask-layer material.
Figure 4:
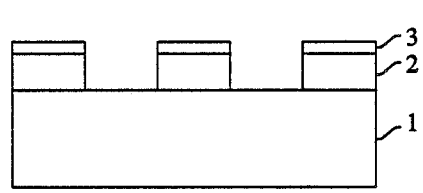
FIG. 4 is a schematic representation of the structure of FIG. 3, the pattern defined in the mask layer having been transferred by selective removal through openings in the mask layer.

Alternate to the situation depicted in FIG. 2, in the case of a positive patterning method, irradiation may result in complete or essentially complete removal of irradiated layer material, thereby leading directly to the structure of FIG. 3. More typically, however, mechanisms other than removal may play a significand role in pattern generation, and indeed, a developing agent for pattern generation can be chosen as based on selectivity of removal of irradiated versus unexposed mask-layer material. Such selectivity in turn may be due, e.g., to compositional selectivity between ion-implanted and unimplanted areas, to damage-selectivity, or to strain-selectivity. In particular, in the case of an epitaxial mask layer, it may suffice merely to selectively disturb the ordered structure of the mask layer as suggested in view of the following: In an indium gallium arsenide mask layer, a pattern can be generated effectively by selective exposure to a flux of gallium ions as $2 \times 10^{13}/cm^2$ which is about two orders of magnitude lower than the surface atom density. Layer material underlying mask areas exposed to such flux may be etched away by a composition- or strain-sensitive etchant, while unexposed areas remain intact. Thus, advantageously, pattern generation may require much less time than would be required for removal of mask material.

Processing in accordance with the invention is readily combined with other processing steps of device manufacture such as, e.g., the deposition of buffer layers, semiconductor channel layers, electro-optically active layers, optical cladding layers, and electrical contacts. Indeed, compatibility with such processing steps (as carried out, e.g., by molecular-beam epitaxial deposition, gas-source molecular-beam epitaxial deposition, metal-organic molecular-beam epitaxial deposition, or metal-organic chemical vapor deposition) is considered to be a key benefit of patterning in accordance with the invention. And, in case of epitaxial deposition of the mask layer, additional layer growth after patterning may proceed without removal of the mask layer.

Example 1.

A 30-Angstrom layer of indium gallium arsenide, $In_{0.53}Ga_{0.47}As$ (as lattice matched to InP), was deposited by molecular-beam epitaxial deposition on a (100)-oriented indium phosphide substrate; growth rate was approximately 100 Angstroms/min. A pattern of 100 rectangles, 5 by 10 micrometers each, was produced on 1-mm centers by gallium-ion exposure of the indium gallium arsenide layer. Apparatus used for patterning included gallium-beam column with an electrostatic focusing lens (magnification unity) and an octopole deflector; the gallium-ion spot size was approximately 0.2 micrometer at a working distance of approximately 50 mm. (With a beam energy of 20 keV, the octopole deflector is capable of scanning a field of approximately 1 mm. Larger areas can be covered by translating the sample as mounted on a computer-controlled x-y stage.) The ion dose was approximately $10^{15}/cm^2$, and the time for "writing" the pattern was less than 2 seconds.

The pattern was transferred to the underlying indium phosphide material by chemical etching in a 3:1 solution of $HCl:H_2O$, resulting in removal of exposed indium phosphide at a rate of approximately 300 Angstroms/sec while leaving the indium gallium arsenide mask layer essentially intact. The depth of the transferred pattern was approximately 1 micrometer which is about 300 times the thickness of the mask layer. After the etching step, the mask was found to be essentially intact, so that greater depth of etching could have been realized simply by longer etching.

Scanning electron micrographs of the etched surface showed excellent edge definition, with roughness less than 0.2 micrometer, and without discernible edge effects.

Example 2

Patterning was carried out as described in Example 1 above except that a (considerably lower) flux of $2 \times 10^{13}/cm^2$ gallium ions was used for pattern generation. The quality of the etched pattern was as in Example 1.

Example 3

On a 1-micrometer layer of $In_{0.53}Ga_{0.47}As$, a 30-Angstrom layer of indium phosphide, InP, was deposited as a mask layer. A pattern was produced in the indium phosphide layer by ion exposure as described above in Example 1, and the pattern was transferred into the indium gallium arsenide layer by etching with a 1:1:10 solution of $H_2SO_4:H_2O_2:H_2O$. Micrographic inspection showed straight, sharp edges as in Example 1.

Example 4

A 100-Angstrom layer of $Si_{0.8}Ge_{0.2}$ was deposited as a mask layer on a silicon substrate. A pattern was produced in the mask layer by gallium-ion exposure as described above in Example 1. The pattern was transferred to the silicon substrate by etching with a strain-selective etchant. (This etch is strain-selective, i.e., the lattice strain of $Si_{0.8}Ge_{0.2}$ decreases the etch rate by over an order of magnitude. Thus, features 1000 Angstroms deep can be etched in silicon while areas not to be etched are covered by as little as 100 Angstroms of $Si_{0.8}Ge_{0.2}$.). Microscopic inspection revealed straight, sharp edges as in Example 1.

We claim:

1. A method for making a device which comprises a patterned layer which here is designated as first layer,
    patterning of said first layer comprising a step of selective removal of first-layer material by exposure to a removal agent in the presence of a patterned second layer,
    said second layer bing deposited as a layer of semiconductor material on said first layer, and
    patterning of said second layer being by maskless ion-beam exposure.

2. The method of claim 1 in which the thickness of said second layer is less than or equal to 100 Angstroms.

3. The method of claim 1 in which the material of said first layer is a semiconductor material.

4. The method of claim 3 in which the material of said first layer is a Group III–V semiconductor material.

5. The method of claim 3 in which the material of said first layer is a Group IV semiconductor material.

6. The method of claim 1 in which said second layer is deposited as an epitaxial layer.

7. The method of claim 6, said method comprising an additional step of epitaxial layer deposition, said additional step being carried out without removal of second layer material after patterning of said first layer.

8. The method of claim 1, patterning of said second layer involving the use of a developing agent.

9. The method of claim 8 in which said developing agent is composition-selective.

10. The method of claim 8 in which said developing agent is damage-selective.

11. The method of claim 8 in which said developing agent is strain-selective.

12. The method of claim 8 in which said developing agent is the same as said removal agent.

13. The method of claim 1 in which selective removal of first-layer material is by dry etching.

14. The method of claim 1 in which said first layer is deposited under high-vacuum conditions.

15. The method of claim 1 in which said second layer is deposited under high-vacuum conditions.

16. The method of claim 1 in which selective removal of first-layer material is under high-vacuum conditions.

* * * * *